United States Patent [19]

Yu et al.

[11] Patent Number: 5,367,206
[45] Date of Patent: Nov. 22, 1994

[54] OUTPUT BUFFER CIRCUIT FOR A LOW VOLTAGE EPROM

[75] Inventors: James Yu; Tiao-Huo Kuo, both of San Jose, Calif.

[73] Assignee: Advanced Micro Devices, Inc., Sunnyvale, Calif.

[21] Appl. No.: 78,711

[22] Filed: Jun. 17, 1993

[51] Int. Cl.⁵ .......................................... H03K 17/16
[52] U.S. Cl. .................. 326/26; 365/189.05; 326/21; 326/122
[58] Field of Search ................... 307/451, 443; 365/189.05, 230.06, 230.08

[56] References Cited

U.S. PATENT DOCUMENTS

| | | | |
|---|---|---|---|
| 4,972,100 | 11/1990 | Lim | 307/443 |
| 4,972,101 | 11/1990 | Partovi | 307/443 |
| 4,975,599 | 12/1990 | Petrovick | 307/443 |
| 5,013,940 | 5/1991 | Ansel | 307/443 X |
| 5,034,629 | 7/1991 | Kinugasa | 307/443 X |
| 5,067,109 | 11/1991 | Kim | 365/189.05 |
| 5,216,293 | 6/1993 | Sei | 307/443 |
| 5,218,247 | 6/1993 | Ito | 307/443 X |
| 5,239,211 | 8/1993 | Jinbo | 307/451 X |
| 5,248,906 | 9/1993 | Mahmood | 307/443 |

*Primary Examiner*—Eugene R. LaRoche
*Assistant Examiner*—Son Mai
*Attorney, Agent, or Firm*—Benman Collins & Sawyer

[57] ABSTRACT

An output buffer circuit is disclosed that operates in low voltage applications but can be programmed using standard programmers at high voltage. The output buffer circuit provides for detecting a program verify logic signal from the programmer and slowing the output driver transistors when that signal is detected. In so doing, the noise problems associated with the higher voltages of programming a EPROM device are eliminated while at the same time allowing the output buffer circuit to operate at the required performance levels during normal operation.

23 Claims, 3 Drawing Sheets

OUTPUT BUFFER CIRCUIT FOR A LOW VOLTAGE EPROM

FIELD OF THE INVENTION

The present invention relates to an output buffer circuit utilized in low voltage EPROM devices and more particularly relates to an improvement to the output buffer circuit which allows for programming the EPROM device without noise problems and without affecting the performance of the output buffer circuit during normal operation.

BACKGROUND OF THE INVENTION

Output buffer circuits are utilized extensively in Electrical Programming Read Only Memory (EPROM) devices for providing an output voltage responsive to an input signal. New EPROM devices, such as the Am27C020 and Am27LV020, manufactured by Advanced Micro Devices, Incorporated are capable of storing information at low voltages. What is meant by low voltage in the context of this application is between 2.7 and 3.6 volts.

Speed is a very important component of output buffer circuits at these low voltages. Hence, in designing these devices, particularly the output buffer circuit, it is important that they operate efficiently at these low voltages. However, it is known that there are problems when programming a low voltage EPROM circuit. For example, it is known that many existing programmer circuits are very poorly grounded in use and when the program verify mode is used, a EPROM could fail.

In addition, ground bounce or ringing on the output device has been a significant problem in programming these types of circuits using traditional programming techniques. Typically, 6 volts or more are required to ensure that the EPROM is properly programmed. Hence, one way to solve the problem is to program the devices at the lower voltages to prevent ringing. However, to program the devices at lower voltages would require significant modifications to existing programming techniques.

Another way of solving the problem would be to utilize a circuit design which would minimize the ground bounce problem associated with programming these low voltage EPROM devices. But in so doing, the performance characteristics of the device would be significantly reduced during normal low voltage operation. Hence, the device would no longer be optimized for speed and would not perform efficiently. Hence, what is needed is an improved output buffer circuit that would allow for the high speed performance characteristic associated with low voltage EPROM devices but at the same time minimizing the noise problems associated with the programming of such a low voltage EPROM device.

The present invention provides circuitry for addressing the above-mentioned need.

SUMMARY OF THE INVENTION

An output buffer circuit in accordance with the present invention operates efficiently at low voltage during normal mode and upon detecting a logic signal the circuit device speed is reduced thereby limiting ground bounce and noise problems associated therewith. The output buffer circuit of the present invention comprises first and second drive transistors for providing drive potential and means for detecting a logic signal. The logic signal indicates that a higher voltage is being provided to the input of the output buffer circuit. Coupled between the detecting means and the first and second drive transistors are means for slowing down the turn on of the first and second drive transistors when the programming verify signal is detected.

Hence, during normal low voltage operation, the output buffer circuit operates in its normal mode at the high speed associated therewith. On the other hand, when the present invention detects the logic signal, the output buffer circuit operates at a reduced speed to prevent the ground bounce or ringing problems associated therewith.

Accordingly, a circuit is provided that does not require any modification of existing programmer device and at the same time allow for fast low voltage EPROM devices to operate efficiently.

DETAILED DESCRIPTION OF THE PREFERRED EMBODIMENT

The present invention relates to an improvement in the output buffer circuit utilized within an EPROM device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
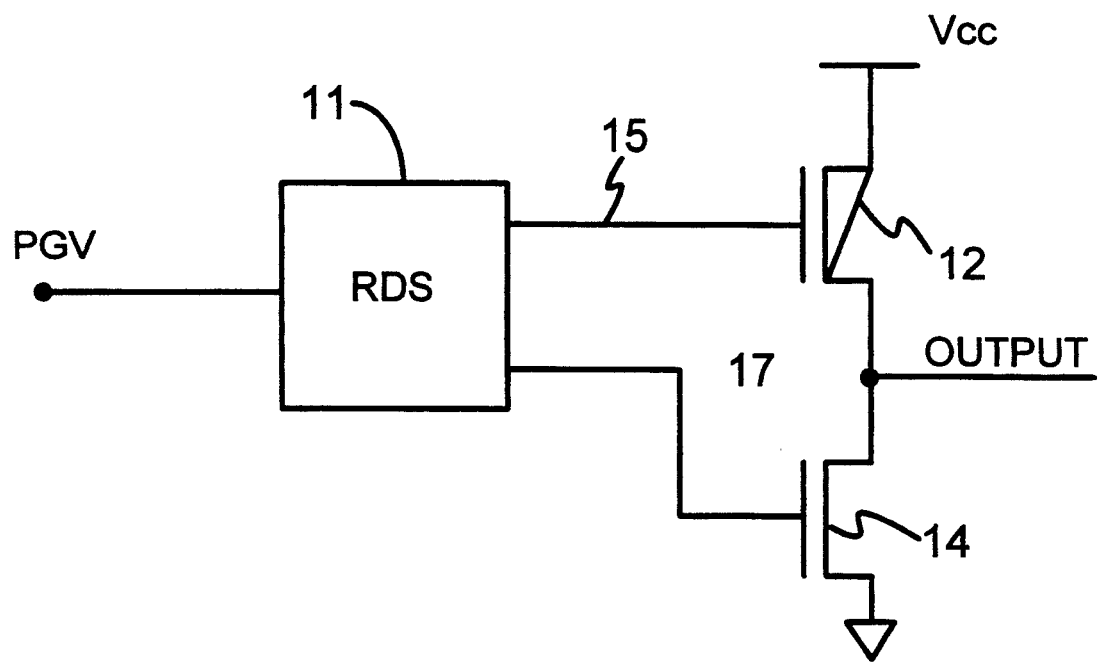
FIG. 1 is a block diagram of output buffer control circuit of the present invention.

FIG. 1 is a block diagram of an output buffer circuit 10 in accordance with the present invention. The buffer circuit 10 includes a reduce device speed (RDS) block 11 which receives logic signal, in this case a programming verify (PGV) signal, and is connected to the gates of transistors 12 and 14 via lines 15 and 17 respectively. In the Figure, the PGV logic signal is detected and sent to RDS block 11. The RDS block 11 responsive to the PGV logic signal will reduce the charge rate on the gates of drive transistor 12 and 14 respectively.

The present invention takes advantage of the PGV logic signal, which is detected during programming verify, to provide an indication that high voltages (for example above 11 volts), are to be provided for programming on VPP and greater than 6.0 volts on VCC and program verify the EPROM. A typical programmer utilized to program an EPROM cell is model number S1000, manufactured by DATA I/O. With the present invention, there is no need to change programming voltage of these standard programmers to accommodate the low voltage (2.7–36 volts) associated with the normal read operation of the EPROM devices.

Hence, the output buffer circuit can operate at its normal speed of less than 20 nanoseconds when in a regular read mode. However, when programming the device, where speed is not important, the PGV signal can be detected and the operating speed of the output buffer current during program verify is reduced.

Figure 2:
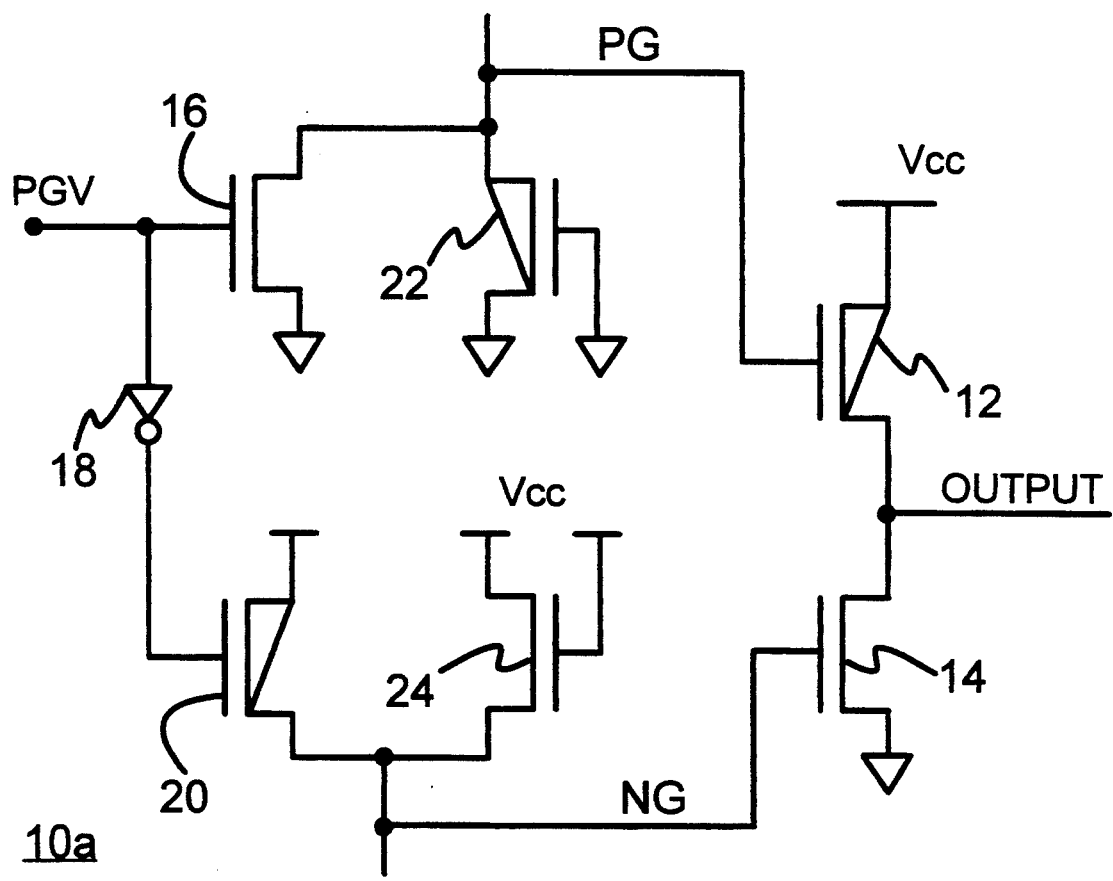
FIG. 2 is a circuit schematic of one embodiment of the output buffer control circuit of FIG. 1.

To more specifically describe the operation of one embodiment of the output buffer circuit of the present invention, refer now to FIG. 2. It should be understood, however, that the improvement as described in conjunction with this figure is capable of a wide variety of modifications and they would be within the spirit and scope of the present invention.

Turning now to FIG. 2, the buffer circuit 10a comprises a pull-up transistor 12 and a pull-down transistor 14. Transistor 12 in this embodiment is a p-channel device. Transistor 14 in this embodiment is an n-channel device. The source of transistor 12 is coupled to $V_{cc}$ and the drain is coupled to the output. The drain of transistor 14 is coupled to the output and the source of transistor 14 is coupled to ground.

The programming verify (PGV) logic signal is provided by the detection of program verify mode to the gate of a strong n-channel transistor 16 and to the input of an inverter 18. The output of the inverter 18 is coupled to the gate of a strong p-channel transistor 20.

The drain of transistor 16 is coupled to ground. The source of transistor 16 is coupled to the gate of transistor 12 and is also coupled to the source of a weaker p-channel transistor 22. The transistor 22 is connected as a diode such that its gate and drain are coupled to ground. In this embodiment, strong transistor 16 has a width to length (w/l) ratio of 40 and the weak transistor has a w/l ratio of 2. In this embodiment, the strong transistor 20 has a w/l ratio of 50 and the weak transistor 24 has a width to length ratio of 2. It should be recognized, however, that a variety of transistors could be utilized that have varying w/l ratios and their use would be within the spirit and scope of the present invention.

The source of transistor 20 is coupled to the gate of transistor 14 and is also coupled to the source of a weaker n-channel transistor 24. The transistor 24 similar to transistor 22 is connected as a diode such that its gate and drain are coupled to $V_{cc}$.

The circuit 10a of FIG. 2 operates in the following manner. During normal operation, that is when the PGV signal is not active, both the strong and weak transistors 16 and 22, 20 and 24 are active to cause transistors 12 and 14 to strongly drive the output respectively.

Figure 3:
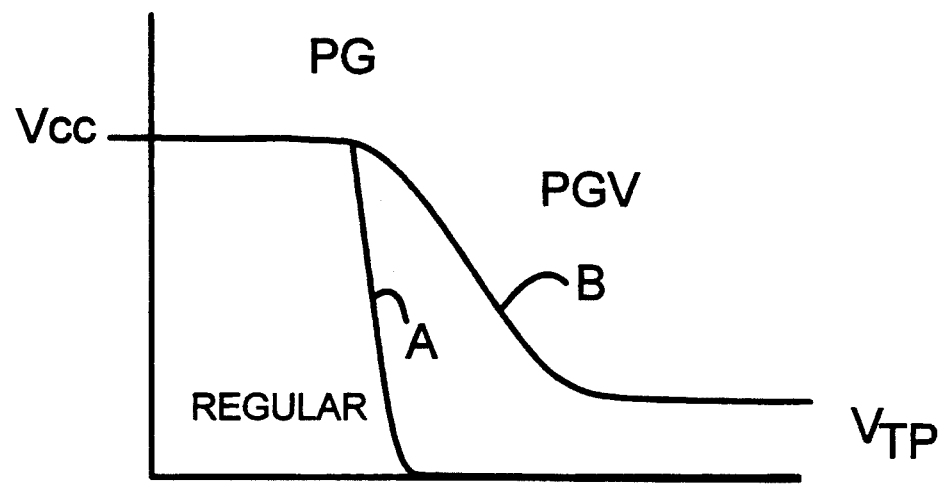
FIG. 3 is a curve showing the operation of the pull up driver transistor of the circuit of FIG. 2.
Figure 4:
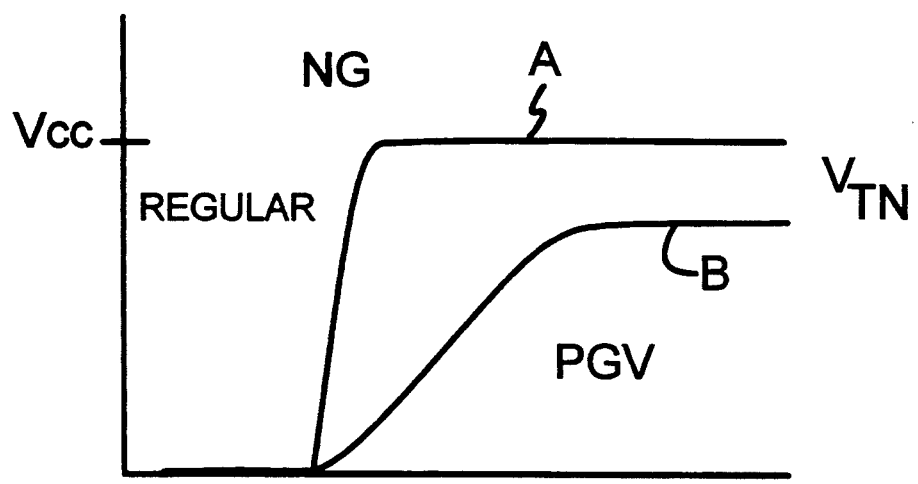
FIG. 4 is a curve showing operation of the pull down driver transistor in the circuit of FIG. 2.

When however, the PGV signal is active, indicating that program verify is to take place at a higher voltage level, the strong transistors 16 and 20 will detect this change and will be disabled, thereby causing the transistors 22 and 24 to weakly turn on their respective drive transistor 12 and 14. Through this action the output of the circuit 10a is slowed sufficiently to minimize ringing and oscillation during programming verify (PGV) mode. FIG. 3 shows curves of the operation of the output buffer circuit 10a when the output is pulled up in the regular mode (A) and when in the PGV mode (B). FIG. 4 shows curves of the operation of the output buffer circuit 10a when the output is pulled down when in the regular mode (A) and when in the PGV mode (B).

Referring first to FIG. 3, when both transistors 16 and 22 (FIG. 2) are on, the output will pull up quickly as represented by curve A due to the discharging current capability on the gate of transistor 12. However, when only transistor 22 is utilized to turn transistor 12 on due to the disabling of transistor 16 by the PGV logic signal, then the output will pull up more slowly because the discharge current capability is reduced for the gate of the transistor 12 (as represented by curve B). By reducing the charge rate, the noise on the output of the output buffer circuit 10a will be significantly reduced thereby allowing for operation of the device reliably at the higher programming voltage.

This circuit has the additional advantage the transistor 22 is not truly grounded. In this embodiment, there is a voltage threshold ($V_{TP}$) drop due to the transistor 22 being in a diode configuration. Therefore, the transistor 12 in addition to the transistor being turned on slowly due to the action of weak transistor 22, it is also turned on weakly due to the diode configuration to further reduce ground bounce problems.

FIG. 4 shows the operation of the pull-down transistor with curve A showing the circuit 10a in normal mode and curve B in PGV mode. Its operation is the complement of that of pull-up transistor 12 of FIG. 3. Accordingly the combination of transistors 20 and 24 has the same advantages as above described in FIG. 3. Hence, when the PGV logic signal is detected the transistor 24 will turn the transistor 14 on more slowly and will also turn the transistor 14 on more weakly due to the diode-connection of transistor 24.

Hence, this improved output buffer circuit allows for the operation of high speed low voltage devices and at the same time when a EPROM needs to be programmed, it can be programmed without the noise problems associated therewith. Therefore the programmer that had been traditionally used to program regular EPROM products can be used with this type low voltage EPROM device without any concern about programming failures or the like.

It should be well recognized that although a specific embodiment of a circuit for slowing the charge on the output of the driver transistors has been described, there are many other types of circuits that could perform this function and those circuits would be within the spirit and scope of the present invention.

In addition, it should be recognized that a key portion of the present invention is the use of a logic signal that indicates a high voltage is to be provided to control the operation of the output buffer circuit. Hence, that control could be handled in a variety of ways after the logic signal is detected to prevent the ground bounce or imaging problem as well as any other types of problems associated with the output of an output buffer circuit. Finally, it should be recognized by one of ordinary skill in the art that there could be a variety of logic signals besides the PGV signal that could provide an indication of a higher voltage operation, and their use would be within the spirit and scope of the present invention.

Although the present invention has been described in accordance with the embodiments shown in the figures one of ordinary skill in the art will recognize there could be variations to those embodiments and those variations would be within the spirit and scope of the present invention. Accordingly, many modifications may be made by one of ordinary skill in the art without departing from the spirit and scope of the present invention, the scope of which is defined solely by the appended claims.

What is claimed is:

1. An output buffer circuit for a low voltage device for allowing for high speed performance while also minimizing noise, the circuit comprising:
   a pull-up transistor for providing a drive potential to an output;
   a pull-down transistor for providing a drive potential to the output;
   means for receiving a logic signal, the logic signal providing an indication that the output buffer circuit is to be operated at a high voltage; and
   means coupled between the receiving means and the pull-up and pull-down transistors for reducing the turn-on speed of the pull-up and pull-down transistors when the logic signal is detected, whereby the output buffer circuit operates at a high speed when the logic signal is not present, indicating that the output buffer circuit is to be operating at a low voltage and at a slower speed when the logic signal is present.

2. The output buffer circuit of claim 1 in which the reducing means comprises:
   a first strong transistor coupled to the logic signal and to the pull-up transistor;
   a first weak transistor coupled to the first strong transistor and to the pull-up transistor;
   an inverter coupled to the logic signal;
   a second strong transistor coupled to the inverter and the pull-down transistor; and
   a second weak transistor coupled to the second strong transistor and the pull-down transistor.

3. The output buffer circuit of claim 2 in which the pull-up transistor, first weak transistor and second strong transistor are p-channel devices.

4. The output buffer circuit of claim 3 in which the pull-down transistor, first strong transistor and second weak transistor are n-channel devices.

5. The output buffer circuit of claim 4 in which the logic signal disables the first and second strong transistors when the logic signal is active.

6. The output buffer circuit of claim 1 in which the logic signal is a programming verify signal.

7. The output buffer circuit of claim 5 in which the first weak transistor is connected as a diode.

8. The output buffer circuit of claim 6 in which the second weak transistor is connected as a diode.

9. The output buffer circuit of claim 8 in which the first and second weak transistors turn on the pull-up and pull-down transistors slowly and weakly where the logic signal is present.

10. The output buffer circuit of claim 1 in which the low voltage is in the range of 2.7–3.6 volts.

11. The output buffer circuit of claim 6 in which the programming verify signal provides the high voltage is 6 volts or greater.

12. In combination with an output buffer circuit, the output buffer circuit comprising a pull-up transistor and a pull-down transistor, the output buffer circuit providing an output voltage responsive to an input signal; the output buffer circuit operating efficiently at a low voltage range; a circuit for allowing for high speed performance while minimizing noise comprising;
    means for receiving a logic signal, the logic signal providing an indication that the output buffer circuit is to be operated at high voltage; and
    means coupled to the detecting means for reducing the speed of the output buffer circuit by reducing the charge rate on the pull-up transistor and pull-down transistor responsive to the detection of the logic signal.

13. The output buffer circuit of claim 12 in which the reducing means comprises:
    a first strong transistor coupled to the receiving means and to the pull-up transistor;
    a first weak transistor coupled to the first strong transistor and to the pull-up transistor;
    an inverter coupled to the logic signal;
    a second strong transistor coupled to the inverter and the pull-down transistor; and
    a second weak transistor coupled to the second strong transistor and the pull-down transistor.

14. The output buffer circuit of claim 13 in which the pull-up transistor, the first weak transistor and the second strong transistor are p-channel devices.

15. The output buffer circuit of claim 14 in which the pull-down transistor, the first strong transistor and the second weak transistor are n-channel devices.

16. The output buffer circuit of claim 15 in which the logic signal disables the first and second strong transistors when the logic signal is detected.

17. The output buffer circuit of claim 12 in which the logic signal is a programming verify signal.

18. The output buffer circuit of claim 16 in which the first weak transistor is connected as a diode.

19. The output buffer circuit of claim 17 in which the second weak transistor is connected as a diode.

20. The output buffer circuit of claim 19 in which the first and second weak transistors turn on the pull-up and pull-down transistors slowly and weakly when the logic signal is detected.

21. The output buffer circuit of claim 12 in which the low voltage range is 2.7–3.6 volts.

22. The output buffer circuit of claim 12 in which the high voltage is 6 volts or greater.

23. An output buffer circuit for a low voltage EPROM device, comprising:
    a p-channel pull-up transistor for providing a drive potential to an output;
    a n-channel pull-down transistor for providing a drive potential to the output;
    means for receiving a programming verify logic signal, first means coupled between the detecting means and the pull-up transistor for turning the pull-up transistor on slowly and weakly responsive to the logic signal being active, the first means includes a strong- n-channel transistor coupled to the detecting means and a p-channel weak transistor coupled to the strong n-channel transistor and to the pull-up transistor, the first weak transistor being connected as a diode; and
    second means coupled between the receiving means and the pull-down transistor for turning the pull-down transistor on slowly and weakly responsive to the logic signal being active, the second means includes a second strong p-channel transistor coupled to the detecting means and a weak n-channel transistor coupled to the strong p-channel transistor and to the pull-down transistor, the weak n-channel transistor being connected as a diode.

* * * * *